United States Patent [19]

Frass et al.

[11] Patent Number: 5,576,137
[45] Date of Patent: Nov. 19, 1996

[54] MATTED, RADIATION-SENSITIVE RECORDING MATERIAL AND PRINTING PLATE

[75] Inventors: Werner Frass; Otfried Gaschler, both of Wiesbaden; Klaus Joerg, Ingelheim; Guenter Hultzsch, Wiesbaden; Andreas Elsaesser, Idstein, all of Germany

[73] Assignee: Agfa-Gevaert AG, Leverkusen, Germany

[21] Appl. No.: 305,647

[22] Filed: Sep. 14, 1994

[30] Foreign Application Priority Data

Oct. 18, 1993 [DE] Germany ............... 43 35 425.4

[51] Int. Cl.⁶ .............. G03F 7/11; G03F 7/023; B41N 1/00
[52] U.S. Cl. .............. 430/166; 430/14; 430/18; 430/165; 430/191; 430/192; 430/193; 430/273.1; 430/302; 430/950; 101/456
[58] Field of Search .............. 430/166, 165, 430/192, 193, 191, 156, 950, 273.1, 302, 14, 18; 104/456

[56] References Cited

U.S. PATENT DOCUMENTS

| | | | |
|---|---|---|---|
| 4,238,560 | 12/1980 | Nakamura et al. | 430/166 |
| 4,266,001 | 5/1991 | Buhr et al. | 430/192 |
| 4,268,611 | 5/1981 | Okishi et al. | 430/166 |
| 4,288,521 | 9/1981 | Koijima et al. | 430/169 |
| 4,557,994 | 12/1985 | Nagano et al. | 430/950 |
| 4,842,982 | 6/1989 | Seibel et al. | 430/156 |

FOREIGN PATENT DOCUMENTS

| | | |
|---|---|---|
| 59417/80 | 1/1981 | Australia . |
| 0344985 | 12/1989 | European Pat. Off. . |
| 0528395 | 2/1993 | European Pat. Off. . |
| 57-115548 | 7/1982 | Japan . |
| 739654 | 11/1955 | United Kingdom . |
| 1542131 | 3/1979 | United Kingdom . |
| 2075702 | 11/1981 | United Kingdom . |
| 2081919 | 2/1982 | United Kingdom . |
| 2046461 | 11/1990 | United Kingdom . |

Primary Examiner—John S. Y. Chu
Attorney, Agent, or Firm—Foley & Lardner

[57] ABSTRACT

The invention relates to a non-continuous matte layer that can be used with a recording material having a substrate and a radiation-sensitive layer which contains a 1,2-naphthoquinone-2-diazide and an organic, polymeric binder which is insoluble in water but soluble in aqueous alkaline solutions. This matte layer comprises 100 to 10,000 particles per square centimeter which have a mean diameter of less than 40 µm and a maximum diameter of less than 80 µm and a mean height of 2 to 6 µm and a maximum height of 10 µm, and contains a resin which has up to 0.80 mmol of acid groups and/or salt groups per gram. The matte layer is obtained by spraying on and drying an aqueous, anionically or anionically/nonionically stabilized dispersion of the resin.

19 Claims, No Drawings

MATTED, RADIATION-SENSITIVE RECORDING MATERIAL AND PRINTING PLATE

BACKGROUND OF THE INVENTION

1. Field of the Invention

The present invention relates to a recording material which includes a substrate, a radiation-sensitive layer which contains a 1,2-naphthoquinone-2-diazide and an organic, polymeric binder which is insoluble in water but soluble in aqueous alkaline solutions, and a non-continuous matte layer present thereon.

2. Description of Related Art

The first step in the production of lithographic printing plates is usually the imagewise exposure of the radiation-sensitive recording materials containing quinonediazide in a vacuum contact printing frame. The original is to be brought into close contact with the recording material as rapidly as possible. After evacuation, no air should remain between the original and the recording material. Similarly, the nitrogen liberated from the quinonediazide during exposure should be removed as rapidly as possible so that no nitrogen pockets form. Both requirements can be met with a recording material whose radiation-sensitive layer is roughened on the surface. The rough surface can be achieved, for example, by dusting prior to imagewise exposure. However, such a process generally produces irregularly roughened surfaces, so that irregular copies are also obtained.

The manufacturers of radiation-sensitive recording materials have therefore made efforts to provide their products with a surface having a defined roughness from the start. Various processes were used. One example is that the substrate can be coated with a radiation-sensitive solution in which water-soluble particles are suspended, which are washed out with water after drying of the layer. The surface of the radiation-sensitive layer then has a large number of indentations.

It has also been proposed to add to the coating solution a compound which eliminates gaseous nitrogen on heating to 80°–300° C. Nitroso, sulfonylhydrazine, azo or hydrazo compounds are particularly suitable. The elimination process starts during drying in the above-mentioned temperature range. The radiation-sensitive layer is provided with a rough surface in this manner.

Finally, it has also been proposed to use a radiation-sensitive coating solution having a resin dispersed therein, which flocculates during drying and is precipitated and thus improves the surface structure. However, none of these processes has become established to date.

A rough surface can also be achieved by applying continuous or discontinuous matte layers. Thus, DE-A 30 09 928 (equivalent to GB-A 2 046 461) describes a process in which a photosensitive layer is coated with a non-photosensitive coating liquid which contains, in dispersed form, particles of polyethylene, polypropylene, ethylene/propylene copolymer, ethylene/vinyl acetate copolymer, polyethylene terephthalate or a crosslinked vinyl polymer. After drying, individual particles remain as very small projections in the continuous top layer.

Continuous or discontinuous top layers having a defined surface roughness can be applied with the aid of an embossing roll. The coating solutions used for this purpose may contain conventional matting agents, such as silica, zinc oxide, titanium dioxide, glass beads, alumina, starch, poly(methyl methacrylate), polystyrene and phenol resins (DE-A 26 06 793 which is equivalent to GB-A 1 542 131).

Finally, a matte surface can also be produced by applying a fine powder which is fused with the surface of a photosensitive layer. For this purpose, the powder must have a softening point which is lower than that of the photosensitive layer. The matting particles generally comprise polyvinyl acetate, polyvinylidene chloride, polyethylene oxide, polyethylene glycol, polyacrylic acid, polymethacrylic acid, polyacrylamide, polymethacrylamide, polybutyl acrylate, polystyrene, polyvinyl methyl ether, epoxy resins, phenol resins, polyamides or polyvinylbutyral (DE-A 30 03 131 equivalent to U.S. Pat. No. 4,288,521).

DE-A 31 31 570 (equivalent to GB-A 2 081 919) discloses a recording material having a photosensitive layer and a matte layer present thereon. The matte layer is applied by spraying on and drying an aqueous solution or dispersion which contains an organic copolymer. Spraying can also be effected electrostatically. The radiation-sensitive layer may contain a 1,2-naphthoquinone-2-diazide and a polymeric binder. As shown in Example 1 of the publication, the matte layers must be capable of being removed during development. A matte layer having copolymers which contain 12% by weight or more of polymer units having salt groups meets this condition. If, however, a copolymer having only 4% by weight of sodium acrylate units is used, the matte material is no longer completely removed, and discoloration (spot formation) therefore occurs during printing.

According to EP-A 0 344 985, the material which gives the discontinuous matted layer is dissolved or dispersed in a hydrocarbon having a certain low conductivity and is sprayed electrostatically on the radiation-sensitive layer. The material used for producing the matted surface may also be photosensitive. The advantage of the process is that the droplets striking the layer have a substantially uniform size.

DE-A 34 33 247 (equivalent to U.S. Pat. No. 4,842,982) describes a radiation-sensitive recording material in which a rough top layer is sprayed onto the radiation-sensitive layer and dried. Both layers have essentially the same composition. If the recording material is exposed to light briefly, as may be necessary for fine screen work, residues of the layer frequently remain in the nonimage parts after development. The residues must then be removed in an additional correction step.

A further possibility for producing a matte photosensitive recording material is to introduce into the photosensitive layer finely divided particles whose smallest dimension is at least as great as the thickness of the layer. The particles may be inorganic or organic (DE-A 29 26 236, which is equivalent to AU-B 59 417/80). Thermally cured phenol resins are described as being particularly suitable (DE-A 31 17 702, which is equivalent to GB-A 2 075 702).

JP-A 57-115 548 discloses a recording material whose radiation-sensitive layer contains hydrophobic silica particles having a mean diameter of less than 500 μm and matting particles comprising polyethylene, polypropylene, ethylene/propylene copolymers or crosslinked vinyl polymers having a mean diameter of from 3 to 40 μm. The $SiO_2$ particles serve for dispersing the matte producing particles.

A recording material in which the radiation-sensitive layer itself is matte has the advantage that, after imagewise exposure and subsequent development, the matte material is retained in the image parts. The separate matte layers described are soluble or dispersible in the developer and are virtually completely removed. However, haloing may occur around the matte producing particles in the radiation-sensi-

SUMMARY OF THE INVENTION

One object of the present invention is to provide a matte, radiation-sensitive recording material which does not have the disadvantages of the known recording materials. In particular, the recording material should be capable of being developed in the nonimage parts without any residues. In the image parts, on the other hand, the matte material should be retained.

Another object of the present invention is to provide a polymer dispersion which can be used to provide a radiation-sensitive recording layer with a matte surface.

In accomplishing the foregoing objects, there has been provided according to one aspect of the present invention a polymer dispersion which includes discrete particles in an aqueous carrier. The discrete particles contain a resin, and the resin contains monomer units which carry at least one of an acid group and a salt group in a total amount of up to 0.80 mmol per gram of resin. The discrete particles have a mean diameter of less than about 40 μm, a maximum diameter of less than about 80 μm, a mean height from about 2 to about 6 μm and a maximum height of up to about 10 μm.

Another aspect of the present invention provides a recording material which includes a substrate, a radiation-sensitive layer on the substrate, and a matte layer on the radiation-sensitive layer. The radiation sensitive layer includes a 1,2-naphthoquinone-2-diazide and an organic, polymeric binder which is insoluble in water but soluble in aqueous alkaline solutions. The matte layer includes discrete particles in an aqueous carrier. The discrete particles include a resin, the resin contains up monomer units which carry at least one of an acid group and a salt group in a total amount of up to 0.80 mmol per gram of resin. The discrete particles have a mean diameter of less than about 40 μm, a maximum diameter of less than about 80 μm, a mean height of from about 2 to about 6 μm and a maximum height of up to about 10 μm and the matting layer is obtained by spraying on and drying an aqueous, anionically or anionically/nonionically stabilized dispersion of the resin.

Further objects, features and advantages of the present invention will become apparent from the detailed description of the preferred embodiments which follows.

DETAILED DESCRIPTION OF THE PREFERRED EMBODIMENTS

The present invention comprises an aqueous, anionically or anionically/nonionically stabilized dispersion of a resin which preferably contains up to about 0.80 mmol of acid groups and/or salt groups per gram of resin.

The present invention also provides a recording material having a substrate, a radiation-sensitive layer which preferably contains a 1,2-naphthoquinone-2-diazide and an organic, polymeric binder which is insoluble in water, but soluble in aqueous alkaline solutions. A matte layer is present thereon and comprises discrete particles. The particles are present in an amount effective to allow air to escape between the original and recording material, and to facilitate the removal of nitrogen as it is formed. The effective amount is preferably from about 100 to about 10,000 particles/cm². The particles preferably have a mean diameter of less than about 40 μm, a maximum diameter of less than about 80 μm, a mean height of from about 2 to about 6 μm and a maximum height of up to about 10 μm; and preferably contain a resin which has up to about 0.80 mmol of acid groups and/or salt groups per gram of resin. The matte layer is obtained by spraying on and drying an aqueous, anionically or anionically/nonionically stabilized dispersion of the resin. Throughout this description, the terms "matte", "matted" and "matting" are defined as providing a slightly roughened surface on the recording material.

Although any desired resin can be used to provide the matte surface, resins particularly suitable for the matting layer are polymers which contain sulfo, carboxyl and/or phosphono groups, either in free form or as a salt with a monovalent or polyvalent cation. The content of acid and/or salt groups preferably is not more than about 0.8 mmol/g. If it is above this value, the matting material in the image parts is also removed during development. When the content of acid groups and/or salt groups in the resin is less than about 0.01 mmol/g, an anionic stabilizer is essential, since otherwise spots occur in the nonimage parts.

Resins containing from about 0.03 to about 0.75 mmol/g of acid groups and/or salt groups are especially preferred.

Although any suitable cation can be used to form the salt, the cations in the salt groups preferably are $Na^+$, $K^+$, $NH_4^+$, $Ca^{2+}$, $Zn^{2+}$ and $Al^{3+}$. The resins are usually polycondensation or polyaddition compounds. Suitable polymer resins are, for example, polyesters, polyamides, polyurethanes or polyureas which have the preferred molar amount of acid groups and/or salt groups. The acid groups or salt groups are preferably bonded to the diol or diamine units in these polymers.

Although any copolymer capable of forming discrete resin particles can be used, copolymers having (a) units of acrylic acid, methacrylic acid, itaconic acid, maleic acid, ethylenesulfonic acid (equivalent to vinylsulfonic acid), styrenesulfonic acid, 2-acryloylamino-1,1-dimethylethanesulfonic acid, vinylphosphonic acid and/or 2-acryloylamino-1,1-dimethylethylphosphonic acid (equivalent to acrylamidoisobutylenephosphonic acid) and salts thereof; and (b) units of acrylates, methacrylates, acrylamides, methacrylamides, styrene, vinyl esters and/or vinyl ethers are especially suitable as resins. The units (a) may also originate from phosphinic acids, such as methylvinylphosphinic acid. The molar amount of the units (a) having acid groups or salt groups is furthermore chosen in the polyaddition compounds so that the polymers contain up to about 0.80 mmol, preferably about 0.01 to 0.75 mmol, of these groups per gram of the resin. The acid groups or salt groups are preferably carboxyl, carboxylate, sulfo, sulfonate, phosphono or phosphonate groups.

In another preferred embodiment, resins which contain no acid groups or salt groups or less than the above-mentioned effective minimum amount of acid groups or salt groups can also be used. In this case, however, the aqueous dispersions are preferably stabilized with anionic surface-active compounds. These compounds generally contain anions of the general formula

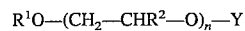

$$R^1O-(CH_2-CHR^2-O)_n-Y$$

in which $R^1$ is a $(C_6-C_{20})$alkyl radical or an unsubstituted or $(C_1-C_{18})$ alkyl-substituted $(C_6-C_{12})$aryl radical, $R^2$ is a hydrogen atom or a methyl group, Y is an $SO_3^-$, $CH_2-CO_2^-$ or $PO_3^{2-}$ group and n is an integer between 0 and 50.

The cations that may also be present in the surface-active compounds are in general sodium, potassium, ammonium, diethamolammonium or triethanolammonium ions. However, other suitable cations may be used.

The anionic surfactants may also be used together with the above-mentioned resins having an effective amount, preferably about 0.01 to about 0.80 mmol/g of acid and/or salt groups. The amount of the ionic surfactants is preferably about 1 to about 20% by weight, based in each case on the total weight of the nonvolatile components of the dispersion.

The sprayable dispersion may additionally contain nonionic surface-active compounds and/or water-soluble protective colloids. Suitable nonionic surface-active compounds are, for example, compounds of the general formula given above, in which Y is a hydrogen atom and $R^1$ may be, in addition to the above-mentioned radicals, a hydrogen atom or a $(C_1-C_5)$alkyl group. However, other suitable nonionic surface-active compounds can be used.

The amount of the nonionic surface-active compounds is preferably up to about 10% by weight, based on the total weight of the nonvolatile components of the dispersion. Although any desired protective colloid can be used, particularly suitable protective colloids are homo- or copolymers of vinyl alcohol, cellulose derivatives, such as methylcellulose, hydroxyethylcellulose and carboxymethylcellulose, starch and starch derivatives, gum arabic, casein, gelatine and polyglycols. The amount of the colloids should preferably not be more than about 30% by weight, based on the total weight of the nonvolatile components of the dispersion. If the amount is above the preferred percentage, the particles for producing a matte surface may become detached in the image parts during development. Lower concentrations of the dispersions may be employed if desired and commercially tolerable. In general, the particle diameter in the horizontal plane of the dried particles increases and the particle height decreases with decreasing concentrations.

The recording material according to the invention can be produced by spraying the above-mentioned aqueous dispersion, which preferably contains from about 5 to about 50% by weight of nonvolatile components, onto the radiation-sensitive layer. Spraying on may preferably be effected by techniques known per se, such as liquid-pressure atomization, for which a one-material nozzle is generally used, air-pressure atomization (two-material nozzle), ultrasonic atomization or electrostatic spraying or by spraying with the aid of an atomizing bell rotating at high speed (about 20,000 revolutions per minute), i.e., the so-called "high-speed bell". An electrical voltage may additionally be applied between the atomizing bell and the substrate to be matted. Other known coating techniques which produce a satisfactory coating can also be used.

The subsequent drying is preferably carried out at temperatures of up to about 140° C., for example with the aid of infrared lamps or in a convection drier. Other dryers effective in drying the dispersion may also be used.

The particles for producing a matte surface applied in this manner are frequently present on the radiation-sensitive layer in the form of more or less flattened hemispheres or hemiellipsoids. Due to their shape, these particles are also referred to as "calottes".

After an evacuation time of about 10 to about 60 seconds in the vacuum contact printing frame, the original and recording material rest uniformly one on top of the other. If a recording material which has calottes having a height of more than about 10 μm is used, poorer reproduction of detailed drawings or features, is observed. If the calottes have a diameter of more than about 80 μm, residues of the layer remain in the nonimage parts after imagewise exposure and development. Calottes having a diameter of less than about 40 μm, particularly, of less than about 20 μm, in the plane of the layer have proven advantageous.

The number of calottes per square centimeter is preferably about 500 to 5,000. Where there are less than about 100 calottes/cm$^2$, large-area screen elements are frequently transferred in a nonuniform manner. A number of more than about 10,000 calottes/cm$^2$ is not disadvantageous but neither produces any further improvement.

In the recording materials according to the present invention, the radiation-sensitive layer contains 1,2-naphthoquinone-2-diazide which is used as a radiation sensitive component and is preferably a derivative of 1,2-naphthoquinone-2-diazido-5-sulfonic acid. The derivative is particularly preferably an ester. If it is intended to produce a negative image (reversal process) from the normally positive-working recording material by additional processing steps, it is more advantageous to use derivatives of the 1,2-naphthoquinone-2-diazido-4-sulfonic acid. Suitable 1,2-naphthoquinone-2-diazides are disclosed in DE-A 938 233 (equivalent to GB-A 739 654), which is hereby incorporated by reference in its entirety, and in DE-A 28 28 037 (equivalent to US-A 4 266 001), which is hereby incorporated by reference in its entirety. The amount of 1,2-naphthoquinone-2-diazides in the radiation-sensitive layer is in general about 3 to 50% by weight, preferably about 8 to about 25% by weight, based in each case on the total weight of the nonvolatile components of the layer. Other suitable radiation sensitive compounds other than 1,2-naphthoquinone-2-diazide may also be used.

The binders used in the radiation-sensitive layers are preferably alkali-soluble binders. Polymers which contain about 1 to about 15 mmol of phenolic hydroxyl groups, oxime groups or sulfonamido groups per gram of polymer are particularly suitable as alkali-soluble binders in the radiation-sensitive layer. These are, for example, cresol/formaldehyde novolaks or copolymers of hydroxystyrene, of hydroxyphenyl or dihydroxyphenyl methacrylate, of hydroxyphenyl- or dihydroxymethacrylamide, of hydroxybenzyl or dihydroxybenzyl methacrylate or of hydroxybenzyl- or dihydroxybenzylmethacrylamide or any other desired polymers containing phenolic hydroxyl groups, oxime groups or sulfonamido groups. The weight average molecular weight ($M_w$) of the polymeric binders is in general about 5,000 to about 100,000. The specific amount of the binder used generally depends on the intended use. In general, it is between about 30 and about 90% by weight, preferably between about 55 and about 85% by weight, based in each case on the total weight of the solids in the layer. Other suitable alkali-soluble binders other than those mentioned above may also be used.

In order to meet specific requirements, such as resistance to chemicals, adhesion, color or color change during baking, the radiation-sensitive layer may optionally contain further components, such as polyglycols, fluorine additives or silicone additives, dyes, adhesion promoters, finely divided pigments, UV absorbers or diazo stabilizers.

In order to render the exposed parts visible, the layer may also contain small amounts of indicator dyes and compounds which form an acid under the action of actinic radiation. The acid then causes a color change in the case of an indicator dye. Suitable acid formers are, for example, 1,2-naphthoquinone-2-diazido-4-sulfonyl chloride, halomethyl-s-triazines substituted by a chromophor, and diazonium salts, particularly diazonium tetrafluoroborates and diazonium hexafluorophosphate. Suitable indicator dyes are, for example, cationic triarylmethane or methine dyes. Other suitable acid formers and indicator dyes may also be used.

If a substrate is to be coated with the above described radiation-sensitive mixture, a solution of the mixture with a solvent is generally applied. The solvent must be tailored to the envisaged coating process, the layer thickness and the drying conditions. Suitable solvents are ketones, such as butanone, chlorinated hydrocarbons (such as trichloroethylene and 1,1,1-trichloroethane), alcohols (such as n-propanol), ethers (such as tetrahydrofuran), glycol monoethers (such as ethylene glycol monoalkyl ethers and propylene glycol monoalkyl ethers) and esters (such as butyl acetate and propylene glycol monoglycol ether acetate). Mixtures of different solvents may also be used. In specific cases, it may be advantageous concomitantly to use further solvents, such as acetonitrile, dioxane, dimethylacetamide or dimethyl sulfoxide. In principle, all solvents which do not react irreversibly with the components of the mixture are suitable. Glycol monoalkyl ethers, in particular ethylene glycol monomethyl ethers and propylene glycol monomethyl ethers, are particularly preferred.

The substrates usually but not necessarily comprise a metal. As a rule, radiation-sensitive recording materials for the production of offset printing plates have, as a substrate, mill-finished aluminum which has been mechanically and/or electrochemically grained and, if required, anodized. The aluminum substrate may also have been chemically pretreated, for example with polyvinylphosphonic acid, silicates, phosphates or hexafluorozirconates or with hydrolyzed tetraethyl orthosilicate.

The coating itself is carried out in a manner known per se, by spin coating, spraying, immersion or by application with rollers, slot dies, knife coaters or casting apparatuses.

For the production of a printing plate, the radiation-sensitive recording material is exposed imagewise under a photographic negative in a vacuum contact printing frame and then developed with an aqueous alkaline developer. Fluorescent tubes, pulsed xenon lamps, mercury vapor lamps doped with metal halide or carbon arc lamps are suitable for exposure. The aqueous alkaline developer may contain small amounts of buffer substances, solvents, surfactants, reducing agents, antifoams, complexing agents, corrosion inhibitors and/or hydrotropic substances in addition to alkali metal silicates. It may furthermore contain carboxylic, sulfonic and/or phosphonic acid. The normality of the alkali metal silicate developer is preferably 0.2 to 1.0 gram equivalent/l. After development, the printing plate may also be gummed. Those skilled in the art are capable of forming an image on a printing plate using the radiation-sensitive recording materials described herein.

The invention will be illustrated in detail with reference to the following Examples without being restricted thereto. Comparative Examples are marked with an asterisk (*). Pbw is "parts by weight". All other abbreviations are stated below.

1. Characteristics of the dispersion:
   SC: Solids content of the dispersion (in % by weight);
   ASG: Acid and/or salt group content (mmol/g of resin); and
   TG: Glass transition temperature (°C.).
2. Characteristics of the layer topography:
   D: Mean calotte diameter (μm);
   Dm: Maximum calotte diameter (μm);
   H: Mean height of the calottes (μm);
   Hm: Maximum height of the calottes (μm); and
   m: Number of calottes per cm².
3. Test criteria:
   T: Evacuation time in seconds for contact between photographic negative and lithographic printing plate;

K: Calottes in image parts after development:
   +=present;
   0=present in parts; and
   −=detached.
S: Spots in nonimage parts after development:
   +=no spots; and
   −=spots present.
R: Screen uniformity; the uniformity of reproduction of a large-area 60-line screen with 20% coverage is evaluated visually as follows:
   +=no fragments;
   0=isolated fragments, slight nonuniformity of screen; and
   −=many fragments, very nonuniform screen.
C: Corona=width of the zone in mm around a 300 μm thick spacer between printing plate and 60-line screen film with 20% coverage, in which the halftone dots are not reproduced. In this test, the susceptibility to air inclusions is investigated.
U: Microline indication in the UGRA offset test wedge.

EXAMPLE 1

A 0.3 mm thick aluminum foil electrolytically grained in hydrochloric acid ($R_z$ value according to DIN 4768, 5.0 μm) was pickled in sulfuric acid and then anodized (oxide weight 3.0 g/m²), rendered hydrophilic with polyvinylphosphonic acid and then coated with the following solution:

5.00 pbw of cresol/formaldehyde novolak resin having a hydroxyl number of 420 according to DIN 53 783/53 240 (corresponding to a hydroxyl group content of 7.5 mmol/g) and an average molecular weight ($M_w$) of 10,000 [determined by gel permeation chromatography (GPC) using a polystyrene standard], 1.20 pbw of an esterification product of 3 mol of 1,2-naphthoquinone-2-diazido-5-sulfonyl chloride and 1 mol of 2,3,4-trihydroxybenzophenone, 0.15 pbw of 1,2-naphthoquinone-2-diazido-4-sulfonyl chloride, 0.05 pbw of Victoria Sky Blue (C.I. 44 045) and 93.60 pbw of a mixture of butanone and propylene glycol monomethyl ether (40/60).

The photoresist coating was dried for 1 minute at 125° C. The layer weight was 2.4 g/m².

An aqueous dispersion of a methacrylic acid/methyl methacrylate/ethyl acrylate copolymer was then sprayed on electrostatically with the aid of a high-speed bell.

Dispersion characteristics

SC=20, anionic surface active compound of the general formula given above in which $R^1$ is $C_9H_{19}$-phenyl-, $R^2$ is H, n is 8 and Y is $SO_3^-$. Cation: $Na^+$. The amount of methacrylic acid varied as in shown Table 1, the amount of ethyl acrylate being constant.

TABLE 1

| Example No. | ASG | in % by weight | TG |
| --- | --- | --- | --- |
| 1–1 | 0.18 | 1.5 | ≧75° C. |
| 1–2 | 0.36 | 3.0 | ≧75° C. |
| 1–4 | 0.53 | 4.6 | ≧75° C. |
| 1–4 | 0.71 | 6.1 | ≧75° C. |
| 1–5* | 0.89 | 1.5 | ≧75° C. |
| 1–6* | 2.32 | 19.9 | ≧75° C. |

Spray conditions

| | |
|---|---|
| Distance from atomizing bell to substrate: | 15 cm |
| Bell speed: | 20,000 rpm |
| Bell diameter: | 6 cm |
| Potential difference | 40 kV |
| Infrared drying | |

Image analysis gave the following values for coating with the calottes: D=30–35 μm, Dm=60–70, H=3–4, Hm=7–9 and m=2,000 to 3,000.

Half the plate was covered with an opaque film while a test original was placed on the other half. Exposure was then effected in a vacuum contact printing frame using a 5 kW metal halide-doped mercury vapor lamp at a distance of 110 cm for 90 s until the film was free from border effects. Development was carried out in an immersion developing apparatus having a brush at a processing speed of 0.8 m/min using a developer solution of the following composition:

| | |
|---|---|
| 0.45 mol/l | of $Na_2SiO_3$, |
| 10 g/l | of benzoic acid and |
| 1 g/l | of nonylphenol ethoxylate (HLB value: 13) |

The results shown in Table 1a were obtained.

TABLE 1a

| Example No. | T | K | S | R | C | U |
|---|---|---|---|---|---|---|
| 1-1-1-4 | <20 | + | + | + | ≦25 | 12 |
| 1-5* | <20 | 0 | + | + | ≦25 | 12 |
| 1-6* | <20 | − | + | + | ≦25 | 12 |

The test original was then placed on the unexposed half of the plate and again brought into contact, exposed and developed as described above. The results shown in Table 1b were then obtained.

TABLE 1b

| Example No. | T | K | S | R | C | U |
|---|---|---|---|---|---|---|
| 1-1-1-4 | <20 | + | + | + | ≦25 | 12 |
| 1-5* | 24 | 0 | + | 0 | 29 | 12 |
| 1-6* | 28 | − | + | − | 36 | 12 |

The results show that noncritical behavior in the halation tests after a development step is observed only in the case of the materials according to the invention.

EXAMPLE 2

A 0.3 mm thick aluminum foil electrolytically grained in hydrochloric acid ($R_z$ value according to DIN 4768: 3.2 μm) was pickled in sulfuric acid and then anodized (oxide weight 2.0 g/m²), rendered hydrophilic with polyvinylphosphonic acid and then coated with the following solution:
4.80 pbw of cresol/formaldehyde novolak resin having a hydroxyl number of 420 according to DIN 53 783/53 240 and an average molecular weight ($M_w$) of 6,000 (determined by GPC using a polystyrene standard),
1.05 pbw of an esterification product of 3 mol of 1,2-naphthoquinone-2-diazido-4-sulfonyl chloride and 1 mol of 2,3,4-trihydroxybenzophenone,
0.30 pbw of bis-(4-hydroxyphenyl) sulfone,
0.05 pbw of 2-(4-styrylphenyl)-4,6-bistrichloromethyl-s-triazine,
0.10 pbw of Crystal Violet (C.I. 42 555) and
93.7 pbw of a mixture of tetrahydrofuran and propylene glycol monomethyl ether (55/45).

The photoresist coating was dried for 1 minute at 125° C. The layer weight was 1.8 g/m².

An aqueous dispersion of a methacrylic acid/styrene/ ethyl acrylate copolymer having a methacrylic acid content of 0.46 mmol/g, corresponding to 4% by weight of methacrylic acid, was then sprayed on electrostatically using a high-speed bell.

Dispersion characteristics

TG about 70° C., SC=varied according to Table 2a, anionic surface active compound according to the general formula, in which $R^1$ is $C_9H_{19}$-phenyl-, $R^2$ is H, n is 8 and Y is $SO_3^-$. Cation: $Na^+$. Protective colloid: 15% by weight of polyvinyl alcohol Mowiol® 3–83 from Hoechst AG), based on SC.

Spray conditions

| | |
|---|---|
| Distance between spray bell and substrate: | 15 cm |
| Bell speed: | 25,000 rpm |
| Bell diameter: | 6 cm |
| Potential difference: | 35 kV |
| Combined convection/IR drying | |

The coating with the calottes shown in Table 2a resulted.

TABLE 2a

| Example | SC | D | Dm | H | Hm | m |
|---|---|---|---|---|---|---|
| 2-1 | 30 | <40 | <80 | 6 | <10 | about 2,000 |
| 2-2 | 25 | <40 | <80 | 5 | <10 | about 2,000 |
| 2-3 | 20 | <40 | <80 | 4 | <10 | about 2,000 |
| 2-4 | 15 | <40 | <80 | 3 | <10 | about 2,000 |
| 2-5* | 10 | <40 | <80 | 2 | <10 | about 2,000 |
| 2-6* | 5 | <40 | <80 | 1 | <10 | about 2,000 |

A test original was placed on a plate and exposed in a vacuum contact printing frame to a 5 kW metal halide-doped mercury vapor lamp at a distance of 110 cm for 60 s. Thereafter, the plate was heated to 140° C. by means of IR radiation in a continuous heating oven with integrated water cooling, exposed without an original and then developed in an immersion developing apparatus having a brush at a processing speed of 0.6 m/min in a developer solution of the following composition:
0.35 mol/l of $Na_2SiO_3$,
10 g/l of benzoic acid and
1 g/l of an ethylene/propylene oxide copolymer (HLB value: 16, average molecular weight ($M_w$): 8,000)

The results shown in Table 2b show that the calottes are retained in the image parts and no layer residues remain behind in the nonimage parts in the case of the recording materials according to the invention, even after a positive/ negative reversal.

TABLE 2b

| Example No. | T | K | S |
|---|---|---|---|
| 2-1-2-4 | <20 | + | + |
| 2-5* | <20 | + | 0 |
| 2-6* | 23 | + | − |

EXAMPLE 3

An aluminum foil according to Example 1 was coated with the following solution:

4.80 pbw of cresol/formaldehyde novolak resin having a hydroxyl number of 420 according to DIN 53 783/53 240 and an average molecular weight ($M_w$) of 6,000 (determined by GPC using a polystyrene standard), 1.05 pbw of an esterification product of 1.4 mol of 1,2-naphthoquinone-2-diazido-4-sulfonyl chloride and 1 mol of 2,3,4-trihydroxybenzophenone, 0.20 pbw of 2,3,4-trihydroxybenzophenone, 0.05 pbw of 2-(4-methoxyphenyl)-4,6-bistrichloromethyl-s-triazine, 0.10 pbw of Crystal Violet (C.I. 42 555) and 93.8 pbw of a mixture of tetrahydrofuran and propylene glycol monomethyl ether (55/45).

The photoresist coating was dried for 1 minute at 125° C. The layer weight was 2.0 g/m².

An aqueous dispersion of a zinc-ammonia complex salt of a methacrylic acid/styrene/ethyl acrylate copolymer having a particle size of less than 100 nm was then sprayed on electrostatically using a high-speed bell under the spray conditions stated in Example 2, different coatings with calottes being obtained by varying the coating speed (see Table 3).

Dispersion characteristics

TG about 75° C., SC=20, anionic surface active compound according to the general formula in which $R^1$ is $C_8H_{17}-$, $R^2$ is H, n is 50 and Y is $PO_3^{2-}$, and nonionic stabilizer in which $R^1$ is $C_{16}H_{33}$, $R^2$ is H, n is 50 and Y is H; amount of methacrylate 0.53 mmol/g, corresponding to 4.6% by weight of methacrylic acid.

The coating with the calottes indicated in Table 3 resulted.

TABLE 3

| Example | D | Dm | H | Hm | m |
|---|---|---|---|---|---|
| 3-1 | <20 | <80 | 3 | <10 | about 30 |
| 3-2 | <20 | <80 | 3 | <10 | about 100 |
| 3-3 | <20 | <80 | 3 | <10 | about 500 |
| 3-4 | <20 | <80 | 3 | <10 | about 1,000 |
| 3-5 | <20 | <80 | 3 | <10 | about 9,000 |
| 3-6 | <20 | <80 | 3 | <10 | about 25,000 |

The plate is brought into contact with a photographic negative in a vacuum contact printing frame by means of evacuation and is exposed to a 5 kW metal halide-doped mercury vapor lamp at a distance of 110 cm for 60 s. It is then heated to 140° C. by means of IR radiation in a continuous heating oven with integrated water cooling, then exposed for 90 s in a vacuum contact printing frame under a photographic positive having test sections for evaluating the halation behavior and the reproduction and then developed in an immersion developing apparatus having a brush at a processing speed of 0.6 m/min in the developer solution of the following composition:

0.25 mol/l of $K_2SiO_3$, 10 g/l of sodium cumenesulfonate and 0.5 g/l of an ethylenediamine/ethylene oxide/propylene oxide copolymer After an evacuation time and a positive exposure, each of 20 seconds, the following values were determined for the above Examples: K/S/R=+, C=≦25, U=12. Slight nonuniformity of the screen was found only in the case of Example 3-1. Thus, good results can be obtained with the recording materials according to the invention also during composing.

EXAMPLE 4

A 0.4 mm thick aluminum foil is grained first mechanically in a pumice powder suspension and then electrolytically in hydrochloric acid ($R_z$ value according to DIN 4768: 6.0 μm), pickled in sulfuric acid and then anodized (oxide weight 4.0 g/m²), rendered hydrophilic with polyvinylphosphonic acid and coated with the following solution:

4.50 pbw of a copolymer of 2-hydroxyphenyl methacrylate and styrene, having a hydroxyl group content of 6.8 mmol/g and an average molecular weight ($M_w$) of 15,000 (determined by GPC using a polystyrene standard), 1.60 pbw of an esterification product of 1.5 mol of 1,2-naphthoquinone-2-diazido-5-sulfonyl chloride and 1 mol of 2,3,4-trihydroxybenzo-phenone, 0.30 pbw of 1,2-naphthoquinone-2-diazido-4-sulfonyl chloride, 0.05 pbw of Victoria Sky Blue (C.I. 44 045) and 93.55 pbw of a mixture of methyl ethyl ketone and propylene glycol monomethyl ether (40/60).

The photoresist coating is dried for 1 minute at 125° C. The layer weight is 2.4 g/m².

An aqueous, anionic dispersion of the following resins is then sprayed on electrostatically using a high-speed bell:

EXAMPLE 4-1

Copolymer of 88% by weight of vinylidene chloride, 5% by weight of acrylonitrile, 4% by weight of methacrylate and 3% by weight of acrylic acid (corresponding to 0.42 mmol/g), stabilizer: dodecylbenzenesulfonate, SC=20.

EXAMPLE 4-2

Copolymer of 70% by weight of styrene, 24.4% by weight of butyl acrylate and 5.6% by weight of sodium ethylenesulfonate having a sulfonate content of 0.43 mmol/g, stabilizer: none, SC=20.

EXAMPLE 4-3

Copolymer of 94.4% by weight of vinyl acetate and 5.6% by weight of sodium ethylenesulfonate having a sulfonate content of 0.43 mmol/g, stabilizer: none, SC=18.

EXAMPLE 4-4

Copolymer of 80% by weight of vinyl acetate and 20% by weight of vinyl chloride, stabilizer: dodecylbenzenesulfonate and polyvinyl alcohol Mowiol® 4-88 from Hoechst AG, 10%, based on SC), SC=18.

Spray conditions

| | |
|---|---|
| Distance between spray bell and substrate: | 15 cm |
| Bell speed: | 30,000 rpm |
| Bell diameter: | 6 cm |
| Potential difference: | 35 kV |
| IR drying | |

Image analysis gives the following values for coating with the calottes: D=25-35 μm, Dm=40-50, H=3-4, Hm=8-10 and m=1,500 to 2,500.

One half of the plate is covered with an opaque film while a test original is placed on the other half, and the plate is placed in a vacuum contact printing frame, evacuated, and exposed to a 5 kW metal halide-doped mercury vapor lamp at a distance of 110 cm for 120 s until the film is free from border effects. Development is effected in an immersion developing apparatus having a brush at a processing speed of 0.8 m/min in a developer solution of the following composition:

0.15 mol/l of $K_2Si_2O_5$ 0.35 mol/l of NaOH
5.00 g/l of polyglycol-600-dicarboxylic acid
10.00 g/l of p-toluenesulfonic acid
1.00 g/l of ethylenediamine-tetrakis-methylene-phosphonic acid The results are the same for all 4 copolymers: T=20, K/S/R=+, C=≦25, U=12.

The test original is then placed on the unexposed half of the plate and again brought into contact, exposed and developed as described above, without the results changing. Consequently, in the case of the materials according to the invention, noncritical behavior is observed in the halation tests even after a development step.

Other embodiments of the invention will be apparent to those skilled in the art from consideration of the specification and practice of the invention disclosed herein. It is intended that the specification be considered as exemplary only, with the true scope and spirit of the invention being indicated by the following claims.

What is claimed is:

1. A recording material comprising: a substrate; a radiation-sensitive layer on said substrate; and a matte layer on said radiation-sensitive layer, wherein said radiation-sensitive layer comprises a 1,2-naphthoquinone-2-diazide and an organic, polymeric binder which is insoluble in water and soluble in aqueous alkaline solutions, wherein said matte layer comprises discrete particles in an aqueous carrier, said discrete particles comprising a resin, which contains monomer units which carry at least one of an acid group and a salt group in a total amount of up to 0.80 mmol per gram of resin, and said discrete particles having a mean diameter of less than about 40 μm, a maximum diameter of less than about 80 μm, a mean height of from about 2 to about 6 μm and a maximum height of up to about 10 μm, and wherein the matting layer is obtained by spraying on and drying an aqueous, anionically or anionically/nonionically stabilized dispersion of the resin.

2. The recording material as claimed in claim 1, wherein said monomer groups carry at least one of an acid group and a salt group, in an amount within a range of about 0.03 to about 0.75 mmol/g.

3. The recording material as claimed in claim 1, wherein said monomer groups carry at least one of an acid group and a salt group, in an amount within a range of about 0.01 to about 0.75 mmol/per gram of resin.

4. The recording material as claimed in claim 1, wherein the at least one of an acid group and a salt group are selected from the group consisting of a carboxyl group, a carboxylate group, a sulfo group, a sulfonate group, a phosphono group, a phosphonate group and mixtures thereof.

5. The recording material as claimed in claim 1, wherein the resin is selected from the group consisting of a polyester, a polyamide, a polyurethane, a polyurea, and mixtures thereof, and wherein said at least one of an acid group and a salt group are bonded to at least one of the diol units and the diamine units of said resin.

6. The recording material as claimed in claim 1, wherein the resin is a copolymer which comprises monomers selected from the group consisting of acrylic acid, methacrylic acid, itaconic acid, maleic acid, vinylsulfonic acid, styrenesulfonic acid, 2-acryloylamino-1,1-dimethylethanesulfonic acid, vinylphosphonic acid and/or 2-acryloylamino-1,1-dimethylethylphosphonic acid, salts thereof and mixtures thereof, and said copolymer further comprises monomers selected from the group consisting of acrylates, methacrylates, acrylamides, methacrylamides, styrene, vinyl esters, vinyl ethers and mixtures thereof.

7. The recording material as claimed in claim 1, wherein the matting layer further comprises an anionic surface-active compound.

8. The recording material as claimed in claim 7, wherein the anionic surface-active compound comprise anions of the formula:

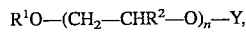

in which
R$^1$ is a (C$_6$–C$_{20}$)alkyl radical or an unsubstituted or (C$_1$–C$_{18}$) alkyl-substituted (C$_6$–C$_{12}$)aryl radical,
R$^2$ is a hydrogen atom or a methyl group,
Y is an SO$_3^-$, CH$_2$—CO$_2^-$ or PO$_3^{2-}$ group and
n is an integer between 0 and 50.

9. The recording material as claimed in claim 1, wherein the matting layer further comprises at least one of nonionic surface-active compounds and water-soluble protective colloids.

10. The recording material as claimed in claim 1, wherein the discrete particles are present as calottes, and said particles are present in said matte layer in an amount of about 100 to about 10,000 calottes/cm$^2$.

11. A printing plate which comprises the recording material according to claim 1, wherein said recording material has been image-developed and is divided into one or more image regions and one or more non-image regions, wherein the image regions comprise the substrate, the radiation sensitive layer and the matte layer, and wherein the non-image regions are free of the radiation sensitive layer and the matte layer.

12. The printing plate as claimed in claim 11, wherein said monomer groups which carry at least one of an acid group and a salt group, and are present in said resin in a range of about 0.01 to about 0.75 mmol/per gram of resin.

13. The printing plate as claimed in claim 11, wherein the at least one of an acid group and a salt group are selected from the group consisting of a carboxyl group, a carboxylate group, a sulfo group, a sulfonate group, a phosphono group, a phosphonate group and mixtures thereof.

14. The printing plate as claimed in claim 11, wherein the resin is selected from the group consisting of a polyester, a polyamide, a polyurethane, a polyurea, and mixtures thereof, and wherein said at least one of an acid group and a salt group are bonded to at least one of the diol units and the diamine units of said resin.

15. The printing plate as claimed in claim 11, wherein the resin is a copolymer which comprises monomers selected from the group consisting of acrylic acid, methacrylic acid, itaconic acid, maleic acid, vinylsulfonic acid, styrenesulfonic acid, 2-acryloylamino-1,1-dimethylethanesulfonic acid, vinylphosphonic acid and/or 2-acryloylamino-1,1-dimethylethylphosphonic acid, salts thereof and mixtures thereof, and said copolymer further comprises monomers selected from the group consisting of acrylates, methacrylates, acrylamides, methacrylamides, styrene, vinyl esters, vinyl ethers and mixtures thereof.

16. The printing plate as claimed in claim 11, wherein the matting layer further comprises an anionic surface-active compound.

17. The printing plate as claimed in claim 16, wherein the anionic surface-active compound comprise anions of the formula:

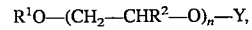

in which $R^1$ is a $(C_6-C_{20})$alkyl radical or an unsubstituted or $(C_1-C_{18})$ alkyl-substituted $(C_6-C_{12})$aryl radical, $R^2$ is a hydrogen atom or a methyl group, Y is an $SO_3^-$, $CH_2-CO_2^-$ or $PO_3^{2-}$ group and n is an integer between 0 and 50.

18. The printing plate as claimed in claim 11, wherein the matting layer further comprises at least one of nonionic surface-active compounds and water-soluble protective colloids.

19. The printing plate as claimed in claim 11, wherein the discrete particles are present as calottes, and said particles are present in said matte layer in an amount of about 100 to about 10,000 calottes/cm².

* * * * *